United States Patent
Sarbanoo et al.

(10) Patent No.: US 8,431,255 B2
(45) Date of Patent: Apr. 30, 2013

(54) GALVANOMAGNETIC DEVICE AND MAGNETIC SENSOR

(75) Inventors: Das Sarbanoo, Kanagawa (JP); Hiroyuki Suzuki, Kanagawa (JP); Takayoshi Ohtsu, Kanagawa (JP)

(73) Assignee: HGST Netherlands BV, Amsterdam (NL)

( * ) Notice: Subject to any disclaimer, the term of this patent is extended or adjusted under 35 U.S.C. 154(b) by 435 days.

(21) Appl. No.: 12/317,534

(22) Filed: Dec. 24, 2008

(65) Prior Publication Data

US 2009/0176129 A1 Jul. 9, 2009

(30) Foreign Application Priority Data

Dec. 27, 2007 (JP) ................................. 2007-336790

(51) Int. Cl.
*G11B 5/39* (2006.01)
*H01L 43/06* (2006.01)
*H01F 10/06* (2006.01)

(52) U.S. Cl.
USPC ............... 428/811.2; 428/811.5; 428/815; 73/779; 324/207.21; 257/421

(58) Field of Classification Search ........................ None
See application file for complete search history.

(56) References Cited

U.S. PATENT DOCUMENTS

| | | | | |
|---|---|---|---|---|
| 4,347,086 A | * | 8/1982 | Chraplyvy et al. | ........... 148/101 |
| 7,379,321 B2 | * | 5/2008 | Ravelosona et al. | .......... 365/145 |
| 2005/0007694 A1 | * | 1/2005 | Takahashi | .................... 360/112 |
| 2006/0268455 A1 | * | 11/2006 | Gerber | .......................... 360/112 |
| 2007/0195452 A1 | * | 8/2007 | Covington et al. | ........... 360/112 |
| 2009/0073747 A1 | * | 3/2009 | Seigler | .......................... 365/158 |

FOREIGN PATENT DOCUMENTS

| | | |
|---|---|---|
| JP | 08-017015 | 1/1996 |
| JP | 2000-306376 | 11/2000 |

OTHER PUBLICATIONS

Das, S., Ito, S., Kitagawa, T., Nakagawa, S., J. Appl. Phys., 97, 10N511-1-10N511-3, 2005.*
Mimura, Y., Imamura, N., Kushiro, Y., J. Appl. Phys., 47(7), 1976, 3371-3373.*
Nakagawa, S., Takayama, K., Sato, A., Naoe, M., J. App. Phys., 85(8), 1999, 4592-4594.*
Nishimura et. al. "Magnetic tunnel junction device with perpendicular magnetization films for high-density magnetic random access memory" Journal of Applied Physics, vol. 91 (No. 8), p. 5246-5249, 2002.
Li et. al. "Effects of MgO tunnel barrier thickness on magnetohysteresis in perpendicularly magnetized magnetic tunnel junctions of GdFeCo/FeCo/MgO/FeCo/TbFe/Co", Journal of Applied Physics, vol. 99, 08T310, 2006.
Hatori et. al. "MTJ elements with MgO barrier using RE-TM amorphous layers for perpendicular MRAM", IEEE Transactions on Magnetics, vol. 43 (No. 6), p. 2331-2333, 2007.

* cited by examiner

*Primary Examiner* — Kevin Bernatz
(74) *Attorney, Agent, or Firm* — Daphne L. Burton; Burton IP Law Group (57) ABSTRACT

Embodiments of the present invention relate to a galvanomagnetic device for use as a magnetic sensor or magnetic memory device. In a particular embodiment, the galvanomagnetic device comprises a non-conductive substrate, a first magnetic layer having a magnetic anisotropy perpendicular to the surface thereof, and a ferromagnetic second magnetic layer formed on the first magnetic layer. On the second magnetic layer, current electrodes are disposed to pass a current between two points, and voltage electrodes are disposed to detect a Hall voltage between two points perpendicularly to the current flow direction.

16 Claims, 5 Drawing Sheets

GALVANOMAGNETIC DEVICE AND MAGNETIC SENSOR

CROSS-REFERENCE TO RELATED APPLICATION

The instant nonprovisional patent application claims priority to Japanese Patent Application No. 2007-336790 filed Dec. 27, 2007 and which is incorporated by reference in its entirety herein for all purposes.

BACKGROUND OF THE INVENTION

Recently, individual users of computing devices have begun to handle large amounts of information. Consequently, the demand for higher density magnetic recording apparatus, representatively hard disk drives (hereinafter, referred to as HDDs); are intensifying more and more. To attain a higher density HDD, it is important to not only increase the linear recording density in the circular direction but also increase the number of tracks spaced in the radial direction of the disk, namely raise Tpi (Tracks per inch). To realize a higher Tpi, it is essential to shorten the track pitch and narrow the track width. To accurately read data recorded on a narrow track, it is important not to read data from adjacent tracks (ie. not to crosstalk). This makes it necessary to narrow the width of the read device.

Figure 3:
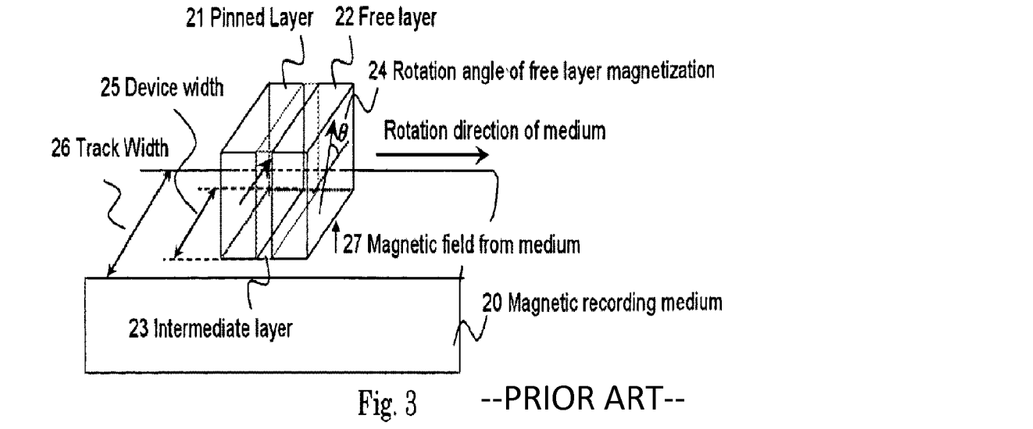
FIG. 3 schematically shows the configuration of a read device using a magneto-resistance effect element.

Read devices in today's HDDs use GMR (Giant Magneto-Resistance) or TMR (Tunnel Magneto-Resistance). FIG. 3 shows the structure of a typical read device located on a track. The read device includes a pinned layer 21 of which magnetization is fixed in one direction and a free layer 22 of which magnetization can rotate freely subject to the external magnetic field. An intermediate layer 23 between the pinned layer 21 and the free layer 22 is a conductive thin film if the read device is a GMR device or an insulation film in the case of a TMR device. Influenced by a magnetic field 27 from the magnetic recording medium 20, the magnetization of the free layer 22 rotates. This rotation angle (θ) 24 differs depending on the direction of the magnetic field 27 from the medium 20. The electric resistance of the whole device changes depending on the relative angle between the magnetization of the pinned layer and the magnetization of the free layer. Information on the medium is read by using this change.

Either of the GMR and TMR devices include what is known as an in-plane magnetization film which is magnetized along the film surface. To fix the magnetization in one in-plane direction, the shape magnetic anisotropy of the device is utilized. However, if the track width 26 is narrowed, the device width 25 must also be narrowed. This weakens the effect of the shape anisotropy and makes the in-plane magnetization curled, resulting in an instable output. This problem is not unique to read devices in HDDs. In the case of the MRAM (Magnetic Random Access Memory), if the cell aspect ratio (length-to-width ratio) is decreased to allow a higher cell density, the in-plane magnetization of the cell may become so curled as to make it impossible to identify "1" or "0" as the information.

Thus, as described by N. Nishimura et. al. "Magnetic tunnel junction device with perpendicular magnetization films for high-density magnetic random access memory" Journal of Applied Physics, Vol. 91 (No. 8), p. 5246-5249, 2002 ("Non-Patent Document 1"), it is proposed to use a perpendicular magnetization film instead of an in-plane magnetization film. The perpendicular magnetization film is magnetized perpendicularly to the film surface and has a merit that magnetization can be kept perpendicular to the film surface not depending on the aspect ratio of the device or cell. As described in Non-Patent Document 1, and by S. C. Li et. al. "Effects of MgO tunnel barrier thickness on magnetohysteresis in perpendicularly magnetized magnetic tunnel junctions of GdFeCo/FeCo/MgO/FeCo/TbFeCo", Journal of Applied Physics, Vol. 99, p. 08T310, 2006 ("Non-Patent Document 2"), and by T. Hatori et. al. "MTJ elements with MgO barrier using RE-TM amorphous layers for perpendicular MRAM", IEEE, Trans. Magn. Vol. 43 (No. 6), p. 2331-2333, 2007 ("Non-Patent Document 3"), a typical data read method uses a magnetic tunnel junction (hereinafter, referred to as MTJ) with perpendicular magnetization films and exploits its tunnel magneto-resistance effect.

Disclosed in JP-A-2000-306376 ("Patent Document 1") is a fine galvanomagnetic device which utilizes the anomalous Hall effect in a multi-layered film comprising a first ferromagnetic layer with magnetic anisotropy perpendicular to the film surface and a second ferromagnetic layer with magnetic anisotropy perpendicular to the film surface. These layers are magnetically coupled via an insulation layer. The read process does not require re-write operation.

The electric resistance of a perpendicular MTJ structure becomes the lowest when the magnetization of the free layer is parallel to that of the pinned layer disposed on the opposite side of the insulation layer, and becomes the highest when they are in antiparallel. If switching the magnetization arrangement between parallel and antiparallel causes a larger change of the electric resistance, the device sensitivity is considered higher. However, to reverse the perpendicular magnetization of the free layer in such a MTJ structure, a high magnetic field of at least 5 kA/m is required. To use a perpendicular MTJ as a read device, it may be desirable that the magnetic field to switch the magnetization of the free layer be lowered to a level of several hundred A/m-2 kA/m. For application as a memory device, it may be desirable to lower the magnetic field required to write to cells in view of reducing power consumption. Further, the quality of the barrier film in the tunnel junction structure is a critical factor in determining the device performance. Although Al or Mg oxide films are mainly used as barrier films, it is not easy to form these films with several nanometer level uniformity.

In the case of devices (memory devices) using the anomalous Hall effect, as described in Patent Document 1, it may be desirable to lower the magnetic field required to reverse the magnetization of the perpendicular magnetization film.

However, since a perpendicular magnetization film generally exhibits a large demagnetizing field perpendicular to the film surface, it is not easy to attain sufficiently soft magnetic properties, namely several hundred A/m in terms of the reversal magnetic field. To use a perpendicular magnetization film for read elements or memory devices, it may be important in design to lower the magnetization reversal field and facilitate the fabrication.

To use a perpendicular magnetization film in a magnetic sensor or magnetic memory device, it may be important to lower its coercivity. It may also be important to design the device which does not require the preparation of homogeneously thick insulation layer.

BRIEF SUMMARY OF THE INVENTION

Embodiments of the present invention relate to a galvanomagnetic device for use as a magnetic sensor or magnetic memory device. The particular embodiment shown in FIG. 1 comprises a non-conductive substrate 10, a first magnetic layer 11 having a magnetic anisotropy perpendicular to the surface thereof, and a ferromagnetic second magnetic layer 12 formed on the first magnetic layer 11. On the second magnetic layer, current electrodes 14a and 14b are disposed to pass a current between two points, and voltage electrodes 15a and 15b are disposed to detect a Hall voltage between two points perpendicularly to the current flow direction.

DETAILED DESCRIPTION OF THE INVENTION

Embodiments of the present invention relate to galvanomagnetic devices and magnetic sensors using galvanomagnetic devices. It is a first object of certain embodiments of the present invention to provide a perpendicular magnetization film-used galvanomagnetic device which allows easy magnetization reversal and eliminates the necessity of fabricating the insulation film and others so uniformly. It is a second object of certain embodiments of the present invention to provide a magnetic sensor which uses a galvanomagnetic device composed of fewer constituent elements.

To attain a the above-mentioned first object, embodiments of the present invention provide a galvanomagnetic device comprising: a non-conductive substrate; a first magnetic layer which is formed on the non-conductive substrate and has a magnetic anisotropy perpendicular to the surface thereof; a second magnetic layer which is formed on the first magnetic layer; electrodes which pass a current through the first magnetic layer and second magnetic layer in an in-plane direction; and electrodes which detect an anomalous Hall voltage which occurs in an in-plane direction perpendicular to the direction of the current.

The saturation magnetization of the second magnetic layer may be set larger than the saturation magnetization of the first magnetic layer.

While the first magnetic layer has a magnetic anisotropy perpendicular to the surface thereof, the second magnetic layer does not necessarily need to have a perpendicular magnetic anisotropy.

The first magnetic layer may be a rare earth/transition metal alloy thin film and the second magnetic layer may be an amorphous rare earth/transition metal alloy thin film. Specifically, the first magnetic layer may be a Gd or other rare earth alloy thin film, a Co/Pt artificial lattice film, or a Co/Pd artificial lattice film. Specifically, the second magnetic layer may be a FeCo alloy thin film or a FeNi alloy thin film. The first magnetic layer may be a FeCoGd alloy thin film and the second magnetic layer is a FeCoB alloy thin film.

In response to an externally applied magnetic field, the second magnetic layer reverses the magnetization thereof and then the first magnetic layer reverses the magnetization therefore with an assist from the second magnetic layer.

To attain the above-mentioned second object, embodiments of the present invention provide a magnetic sensor comprising: a non-conductive substrate; a first magnetic layer which is formed on the non-conductive substrate and has a magnetic anisotropy perpendicular to the surface thereof; a second magnetic layer which is formed on the first magnetic layer; electrodes which pass a current through the first magnetic layer and second magnetic layer in an in-plane direction; and electrodes which detect an anomalous Hall voltage which occurs in an in-plane direction perpendicular to the direction of the current, wherein with the current kept flowing between the current electrodes, the magnetization direction of the first magnetic layer magnetized by an external magnetic field is detected as a signal by detecting an anomalous Hall voltage from the voltage electrodes.

According to embodiments of the present invention, it is possible to provide a perpendicular magnetization film-used galvanomagnetic device which allows easy magnetization reversal and eliminates the necessity of fabricating the insulation film and others so uniformly. As well, it is also possible to eliminate the necessity of forming hard bias films for pinning the magnetization of a magnetic layer in a magnetic sensor that uses the galvanomagnetic device.

The following will describe the configuration of a galvanomagnetic device according to an embodiment of the present invention with reference to the drawings.

Figure 1:
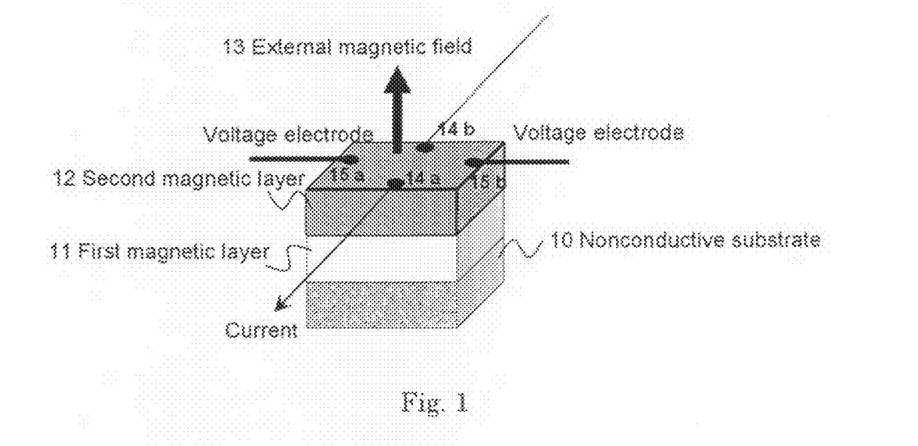
FIG. 1 is a perspective illustration showing the configuration of a galvanomagnetic device according to an embodiment of the present invention.

FIG. 1 shows the structure of the galvanomagnetic device. Reference numeral 10 refers to a non-conductive substrate. Reference numeral 11 is a first magnetic layer with magnetic anisotropy perpendicular to the film surface. Reference numeral 12 is a second magnetic layer having ferromagnetism. Electrodes 14a and 14b are disposed to pass a current between two points on the second magnetic layer. The current flows frontward from the back of the figure. In addition, electrodes 15a and 15b are disposed at two different points on the second magnetic layer so as to detect a Hall voltage perpendicular to the current flow direction.

The first magnetic layer 11 of this galvanomagnetic device is a perpendicular magnetization film. Information recorded in this film as magnetization therein is directed "upward" or "downward". In addition, the recorded information is read by detecting the polarity of the Hall voltage subject to this film.

The substrate 10 is made of glass or other non-conductive material. If a conductive substrate is used, the current applied to the whole device for the purpose of reading data may partly go through the substrate. In this case, a Hall voltage produced by the substrate may be superposed. Use of a non-conductive substrate can suppress the influence of the substrate on the output Hall voltage signal.

For example, the first magnetic layer 11 may be a rare earth/transition metal alloy thin film or an artificial lattice film. The rare earth/transition metal alloy thin film is amorphous. It is possible to give perpendicular magnetic anisotropy to the thin film by adjusting its composition. The saturation magnetization of the rare earth/transition metal alloy thin film is the lowest with a small demagnetizing field when the rare earth metal (or transition metal) content is adjusted so that perpendicular magnetic anisotropy appears. For example, if the rare earth/transition metal alloy film contains Gd as the transition metal, it is possible to attain a reversal magnetic field (coercivity) of several kA/m. The first magnetic layer 11 may also be a Co/Pt or Co/Pd artificial lattice film. In this case, if the film is fabricated, for example, by sputtering, it is possible to either raise or lower the coercivity by optimizing the gas pressure, layer count and layer thickness. As well, it is possible to change the saturation magnetization and perpendicular magnetic anisotropy of the artificial lattice film by adjusting the fabrication process. In the case of the galvanomagnetic device of an embodiment of the present invention, it is important to make it easy to reverse the magnetization in the first magnetic layer. It is therefore preferable to set the magnetic anisotropy to, for example, as low as several kA/m.

The second magnetic layer 12 is a ferromagnetic layer. As compared with the first magnetic layer 11, the saturation magnetization is somewhat higher and the perpendicular anisotropy is lower by one to two digits. The magnetic anisotropy of the second magnetic layer 12 does not need to be weak everywhere. For example, portions with perpendicular magnetic anisotropy may be dispersed in all in-plane directions. Since the second magnetic layer 12 is present on the first magnetic layer 11, their magnetic coupling is strong. Use of the magnetic interaction between the two layers makes it possible to lower the magnetization reversal field of the first magnetic layer 11. Increasing the saturation magnetization of the second magnetic layer 12 enhances the magnetic interaction between the two layers and consequently makes it easy to reverse the magnetization of the first magnetic layer 11. For example, the second magnetic layer 12 may be an amorphous rare earth/transition metal alloy thin film. Reducing the rare earth metal content and increasing the transition metal content lower the perpendicular magnetic anisotropy and increase the saturation magnetization. As well, a Fe—Co or Fe—Ni alloy thin film may be used since high saturation magnetization can be expected. It is possible to adjust the saturation magnetization by changing the Fe content. Generally, if sputtering is employed to form such an alloy thin film, perpendicular magnetic anisotropy is not induced in the film since grains grow mainly in in-plane directions. Thus, with no applied external magnetic field, magnetization of the alloy thin film occurs in in-plane directions.

Figure 2:
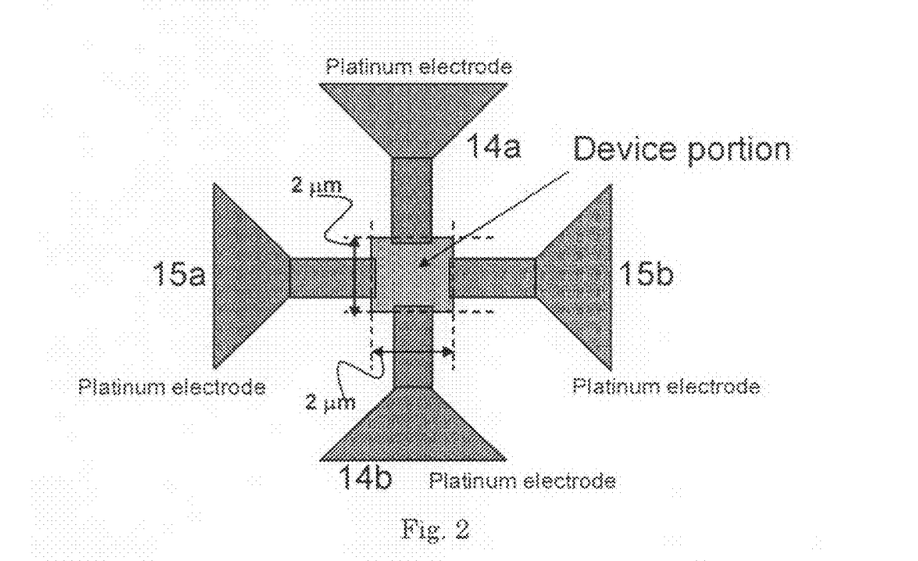
FIG. 2 is a schematically depicted top view of the galvanomagnetic device shown in FIG. 1.
Figure 4:
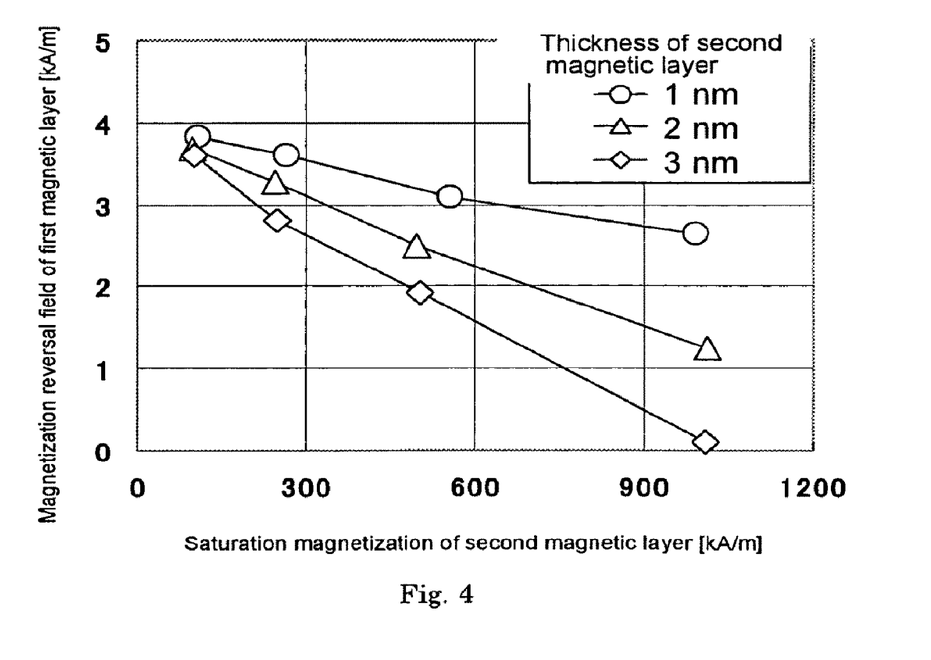
FIG. 4 is a graph for showing how the magnetization reversal field of the first magnetic layer changes as the saturation magnetization of the second magnetic layer is changed.

The following describes magnetization reversal characteristics of the galvanomagnetic device. As samples, a 5 nm-thick first magnetic layer 11 of $(Fe_{90}Co_{10})_{80}Gd_{20}$ was formed by sputtering and second magnetic layer 12 of $(Fe_xCo_{100-x})_{1-y}B_y$ of three different thicknesses of 1 nm, 2 nm and 3 nm respectively were formed thereon. The saturation magnetization of each second magnetic layer 12 was changed by adjusting each element's content of the second layer 12. Then, the films were patterned to 2 μm×2 μm by lithographic patterning as shown in FIG. 2. Pt electrodes were formed as current application electrodes 14a and 14b and Hall voltage detection electrodes 15a and 15b. FIG. 4 shows how the magnetization reversal field of the first magnetic layer 11 changes as the saturation magnetization of the second magnetic layer 12 is changed. The three lines in FIG. 4 are respectively associated with the three second magnetic layers 12 which differ in thickness. Increasing the saturation magnetization of the second magnetic layer 12 enhances the magnetic interaction between the first magnetic layer 11 and the second magnetic layer 12 and consequently lowers the magnetization reversal field of the first magnetic layer 11. Making thicker the second magnetic layer 12, also lowers the magnetization reversal field of the first magnetic layer 11.

Figure 5:
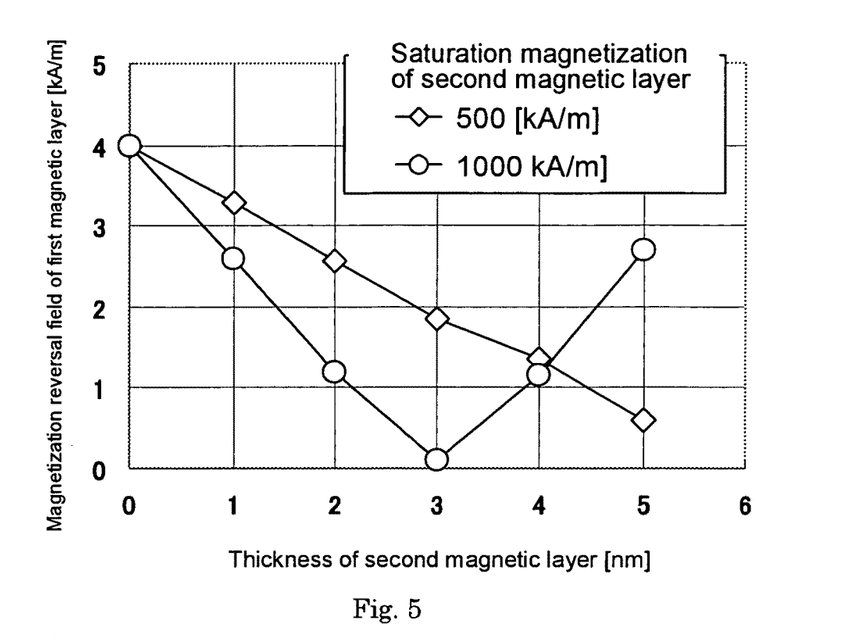
FIG. 5 is a graph for showing how the magnetization reversal field of the first magnetic layer changes as the thickness of the second magnetic layer is changed.

FIG. 5 shows how the magnetization reversal field of the first magnetic layer 11 changes as the thickness of the second magnetic layer 12 is changed. The two lines are respectively associated with two second magnetic layers 12 which differ in saturation magnetization. Although it is possible to lower the magnetization reversal field of the first magnetic layer 11 by thickening the second magnetic layer 12, the magnetization reversal field also depends on the saturation magnetization of the second magnetic layer 12. Increasing the saturation magnetization and thickness of the second magnetic layer 12 extremely enhances the magnetic interaction between the two layers, resulting in a larger magnetization reversal field of the first magnetic layer 11 on the contrary. It is possible to attain a desired magnetization reversal field of the first magnetic field 11 by adjusting the thickness and saturation magnetization of the second magnetic layer 12.

Figure 6:
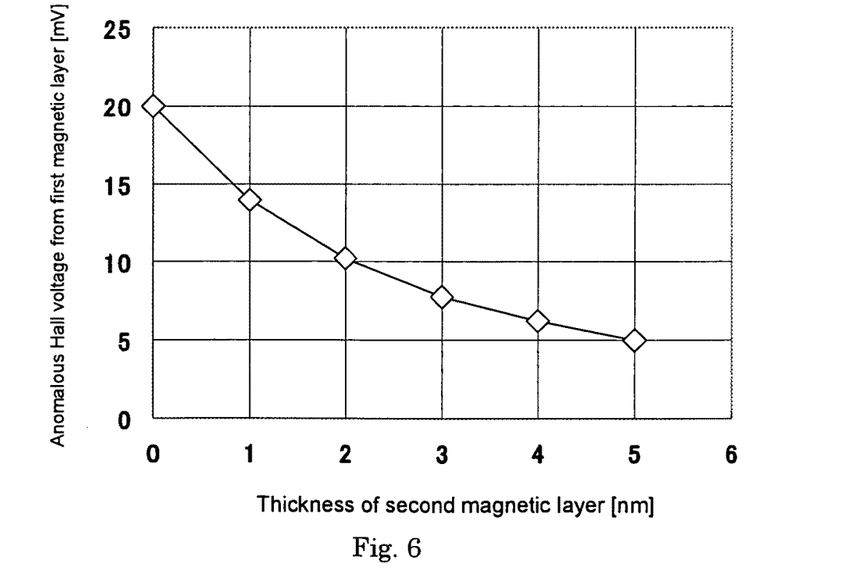
FIG. 6 is a graph for showing how the anomalous Hall voltage derived from the first magnetic layer is dependent on the thickness of the second magnetic layer.

FIG. 6 shows how the anomalous Hall voltage derived from the first magnetic layer 11 is dependent on the thickness of the second magnetic layer 12. Thickening the second magnetic layer 12 lowers the anomalous Hall voltage detected from the first magnetic layer 11. This is because thickening the second magnetic layer 12 increases the current which flows through the second magnetic layer 12 and decreases the current which flows through the first magnetic layer 11. To lower the magnetization reversal field of the first magnetic layer 11, it is therefore effective to decrease the thickness of the second magnetic layer 12 as much as possible while raising the saturation magnetization.

Figure 7:
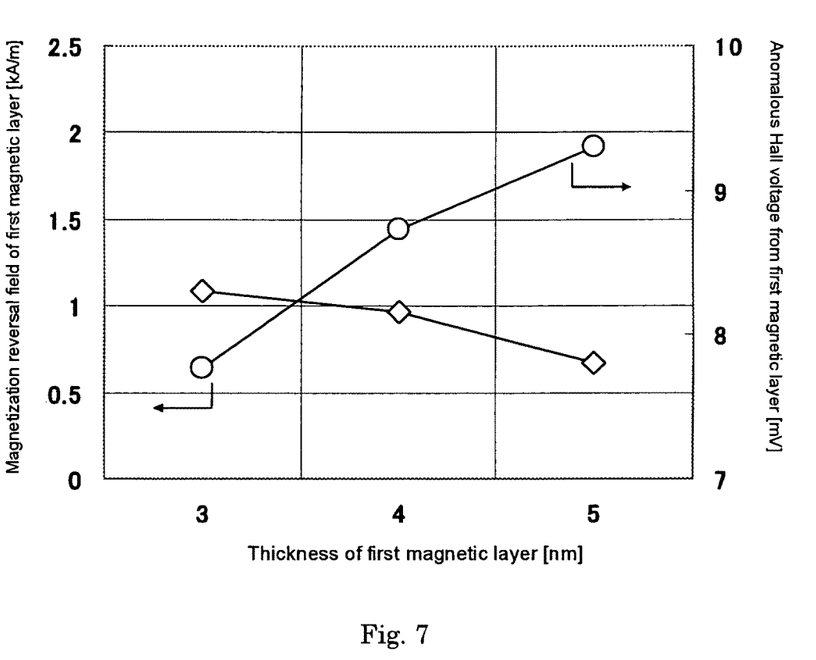
FIG. 7 is a graph for showing how the magnetization reversal field (left vertical axis) of the first magnetic layer and the anomalous Hall voltage (right vertical axis) derived from the first magnetic layer are dependent on the thickness of the first magnetic layer.

FIG. 7 shows how the magnetization reversal field (left vertical axis) of the first magnetic layer 11 and the anomalous Hall voltage (right vertical axis) derived from the first magnetic layer 11 are dependent on the thickness of the first magnetic layer 11. The thickness of the second magnetic layer 12 is fixed to 3 nm. Thinning the first magnetic layer 11 lowers its magnetization reversal field and raises the anomalous voltage derived therefrom.

As mentioned above, it is possible to not only lower the magnetic field required to reverse the magnetization in the first magnetic layer 11 but also obtain a large anomalous Hall voltage derived from the first magnetic layer 11 by adjusting the thickness of the first magnetic layer 11, thickness of the second magnetic layer 12 and saturation magnetization of the second magnetic layer 12.

Figure 8:
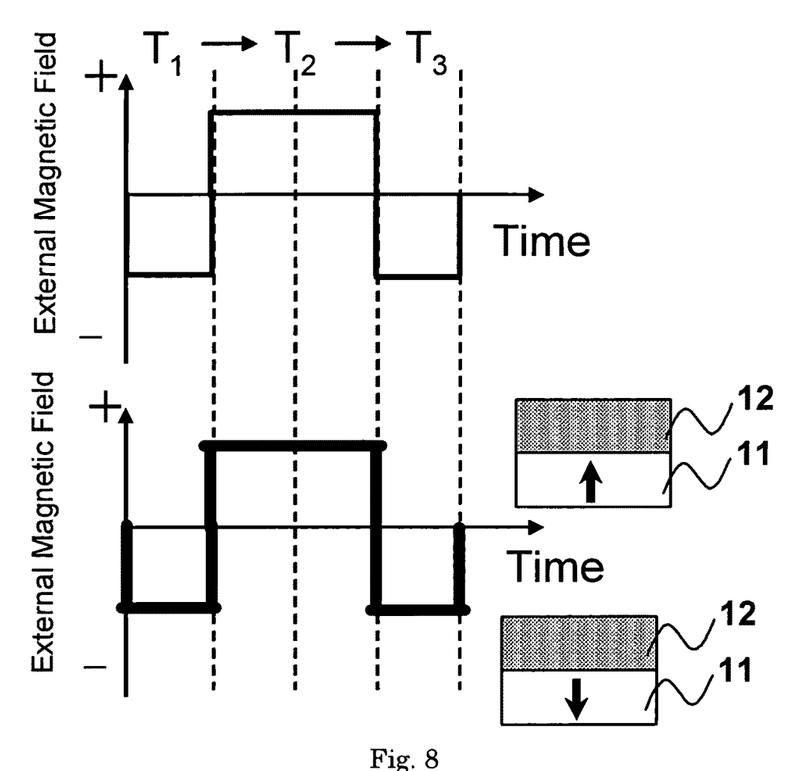
FIG. 8 is a time chart for showing the operation of a magnetic sensor using the galvanomagnetic device according to an embodiment of the present invention.

The following describes the operation of the galvanomagnetic device according to the embodiment shown in FIG. 1 when it is used as a magnetic sensor. FIG. 8 shows its operation time chart. The upper part of this time chart shows how a magnetic field (external magnetic field from a rotating perpendicular magnetic recording medium) changes with time. Because of use as a magnetic sensor, a current (sense current) is kept flowing between the current electrodes 14a and 14b. When the external magnetic field is negative (state $T_1$ in FIG. 8), the first magnetic layer 11 is magnetized "downward" and the Hall voltage derived therefrom is negative. If the polarity of the external magnetic field changes from negative to positive, magnetization of the first layer 11 reverses or turns "upward" with an assist from the second magnetic layer 12. If the magnetization reverses, the polarity of the anomalous Hall voltage derived from the first magnetic layer 11 switches from positive to negative (state $T_2$ in FIG. 8). After that, if the external magnetic field changes from positive to negative, the magnetization of the first magnetic layer 11 reverses or turns downward and the polarity of the anomalous Hall voltage becomes negative as in state $T_3$ of FIG. 8. With this operation, it is possible to detect the magnetization direction of the first magnetic layer 11 as the signal of the magnetization pattern recorded on the perpendicular magnetic recording medium.

When the device is used as a read device (magnetic sensor) in a HDD, a current must be kept flowing through the device. However, in the case of application in a magnetic memory device, a current must be applied to a cell only when information is to be read from the cell. In this case, an anomalous Hall voltage is generated therein and its polarity is recognized.

As described earlier, conventional magnetic sensors or magnetic memory devices based on perpendicular magnetic film have device portions with higher magnetization reversal field. It is not easy to fabricate a perpendicular magnetization film whose magnetization reversal field is sufficiently low or whose magnetism is sufficiently soft. In the case of the galvanomagnetic device mentioned so far, a soft magnetic film is deposited on a perpendicular magnetic film. Due to magnetic coupling between them, the magnetization reversal field of the perpendicular magnetization film can be reduced. In addition, since the state of magnetization can easily be recognized by utilizing the anomalous Hall effect exhibited by the perpendicular magnetization film. This structure also provides a merit that there is no need to form such an insulation layer as included in a magnetic tunnel junction.

In addition, since a perpendicular magnetization film is used, magnetization of the device can be kept "upward" or "downward" with regard to the film surface even if the device's aspect ratio is reduced. The proposed device, which uses perpendicular magnetization film in the sensor part, does not require a hard bias film to pin magnetization necessary in the conventional read devices used in the HDD. Further, as compared with the conventional read device using the TMR structure which needs a uniform thickness insulation layer between magnetic layers, it is possible to improve the process reliability and consequently attain a higher yield ratio since there is no need to form such an insulation layer.

What is claimed is:

1. A galvanomagnetic device comprising:
a non-conductive substrate; a first magnetic layer formed on the non-conductive substrate and has a magnetic anisotropy perpendicular to the surface thereof; a second magnetic layer formed on the first magnetic layer; electrodes which pass a current through the first magnetic layer and the second magnetic layer in a first in-plane direction; and electrodes which detect an anomalous Hall voltage which occurs in a second in-plane direction perpendicular to the direction of the current;
wherein the anomalous Hall voltage and/or a magnetization reversal field of the first magnetic layer are configured according to a thickness of the first magnetic layer, a thickness of the second magnetic layer and a saturation magnetization of the second magnetic layer;
wherein the thickness of the first magnetic layer is between about 3 nanometers and about 5 nanometers, the thickness of the second magnetic layer is less than about 5 nanometers, and the saturation magnetization of the second magnetic layer is less than about 1000 kiloamperes per meter; and
wherein the saturation magnetization of the second magnetic layer is larger than a saturation magnetization of the first layer.

2. A galvanomagnetic device according to claim 1 wherein a saturation magnetization of the second magnetic layer is larger than a saturation magnetization of the first magnetic layer.

3. A galvanomagnetic device according to claim 1 wherein the second magnetic layer has magnetically anisotropic portions dispersed uniformly in all in-plane directions.

4. A galvanomagnetic device according to claim 1 wherein the anomalous Hall voltage occurs in the first magnetic layer.

5. A galvanomagnetic device according to claim 1 wherein the first magnetic layer is a rare earth/transition metal alloy thin film, and the second magnetic layer is an amorphous rare earth/transition metal alloy thin film.

6. A galvanomagnetic device according to claim 1 wherein the first magnetic layer comprises a Gd or another rare earth alloy thin film, a Co/Pt artificial lattice film, or a Co/Pd artificial lattice film.

7. A galvanomagnetic device according to claim 6 wherein the second magnetic layer comprises a FeCo alloy thin film, or a FeNi alloy thin film.

8. A galvanomagnetic device according to claim 1 wherein the first magnetic layer comprises a FeCoGd alloy thin film, and the second magnetic layer comprises a FeCoB alloy thin film.

9. A galvanomagnetic device according to claim 1 wherein in response to an externally applied magnetic field, the second magnetic layer reverses its magnetization and then the first magnetic layer reverses its magnetization, and wherein the second magnetic layer facilitates the reversal of magnetization of the first magnetic layer.

10. A magnetic sensor comprising:
a non-conductive substrate; a first magnetic layer formed on the non-conductive substrate and having a magnetic anisotropy perpendicular to the surface of the non-conductive substrate;
a second magnetic layer which is formed on the first magnetic layer;
electrodes which pass a current through the first magnetic layer and the second magnetic layer in a first in-plane direction; and
electrodes which detect an anomalous Hall voltage which occurs in a second in-plane direction perpendicular to the direction of the current;
wherein when the current is kept flowing between the current electrodes, the magnetization direction of the first magnetic layer magnetized by an external magnetic field, is detected as a signal by detecting an anomalous Hall voltage from the voltage electrodes;
wherein the anomalous Hall voltage and/or a magnetization reversal field of the first magnetic layer are configured according to a thickness of the first magnetic layer, a thickness of the second magnetic layer and a saturation magnetization of the second magnetic layer;
wherein the thickness of the first magnetic layer is between about 3 nanometers and about 5 nanometers, the thickness of the second magnetic layer is less than about 5 nanometers, and the saturation magnetization of the second magnetic layer is less than about 1000 kiloamperes per meter; and
wherein the saturation magnetization of the second magnetic layer is larger than a saturation magnetization of the first layer.

11. A magnetic sensor according to claim 10 wherein the anomalous Hall voltage occurs in the first magnetic layer.

12. A magnetic sensor according to claim 10 wherein the first magnetic layer is a rare earth/transition metal alloy thin film, and the second magnetic layer is an amorphous rare earth/transition metal alloy thin film.

13. A magnetic sensor according to claim 10 wherein the first magnetic layer comprises a Gd or another rare earth alloy thin film, a Co/Pt artificial lattice film, or a Co/Pd artificial lattice film.

14. A magnetic sensor according to claim 13 wherein the second magnetic layer comprises a FeCo alloy thin film, or a FeNi alloy thin film.

15. A magnetic sensor according to claim 10 wherein the first magnetic layer comprises a FeCoGd alloy thin film, and the second magnetic layer comprises a FeCoB alloy thin film.

16. A magnetic sensor comprising:
a non-conductive substrate;
a first magnetic layer formed on the non-conductive substrate and having a magnetic anisotropy perpendicular to the surface of the non-conductive substrate;
a second magnetic layer which is formed on the first magnetic layer; electrodes which pass a current through the first magnetic layer and the second magnetic layer in a first in-plane direction; and
electrodes which detect an anomalous Hall voltage which occurs in a second in-plane direction perpendicular to the direction of the current;
wherein when the current is kept flowing between the current electrodes, the magnetization direction of the first magnetic layer magnetized by an external magnetic field, is detected as a signal by detecting an anomalous Hall voltage from the voltage electrodes;
when the external magnetic field is negative, the first magnetic layer is magnetized downward and the Hall voltage derived therefrom is negative, and
if the polarity of the external magnetic field changes from negative to positive, magnetization of the first layer reverses and turns upward wherein the second magnetic layer facilitates the reversal of magnetization of the first magnetic layer, and the polarity of the anomalous Hall voltage derived from the first magnetic layer switches from positive to negative, and
if the external magnetic field changes from positive to negative, the magnetization of the first magnetic layer reverses and turns downward and the polarity of the anomalous Hall voltage becomes negative; and
wherein the anomalous Hall voltage and/or a magnetization reversal field of the first magnetic layer are dependent on a thickness of the first magnetic layer, a thickness of the second magnetic layer and a saturation magnetization of the second magnetic layer;
wherein the thickness of the first magnetic layer is between about 3 nanometers and about 5 nanometers, the thickness of the second magnetic layer is less than about 5 nanometers, and the saturation magnetization of the second magnetic layer is less than about 1000 kiloamperes per meter; and
wherein the saturation magnetization of the second magnetic layer is larger than a saturation magnetization of the first layer.

* * * * *